Figure 1:
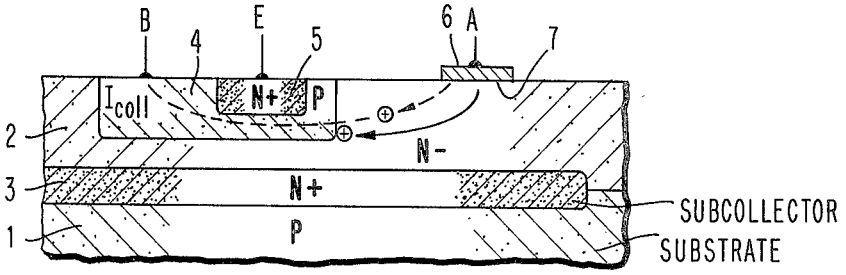
PRIOR ART FIG. 1
Figure 3:
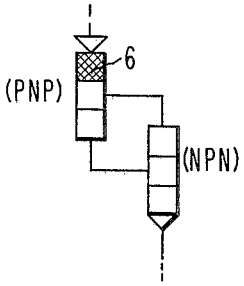
Figure 2:
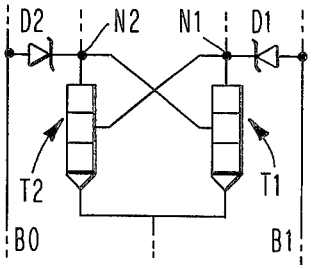
Figure 3A:
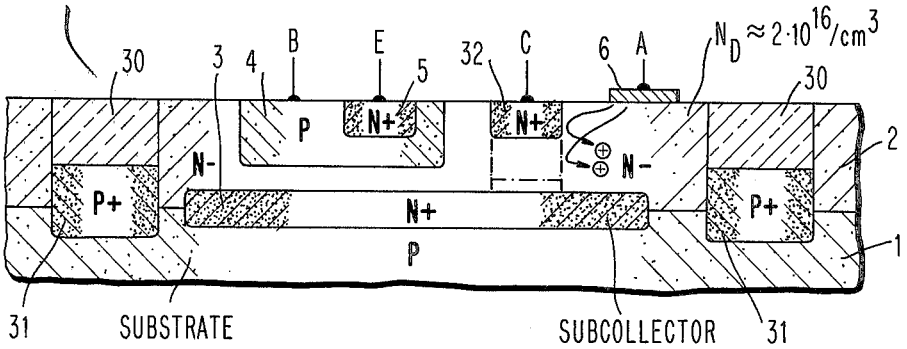
Figure 3B:
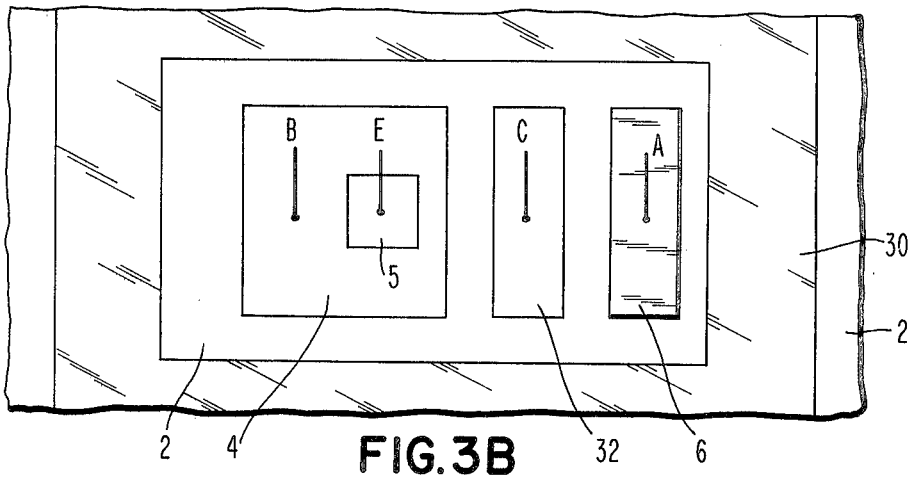
Figure 4A:
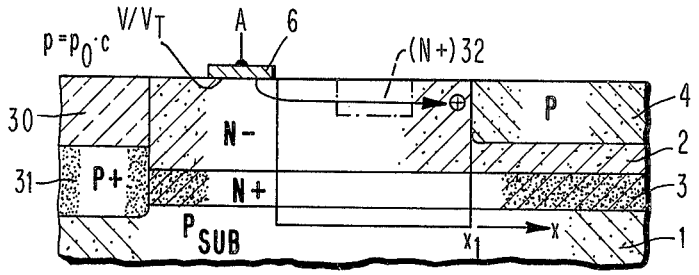
Figure 4B:
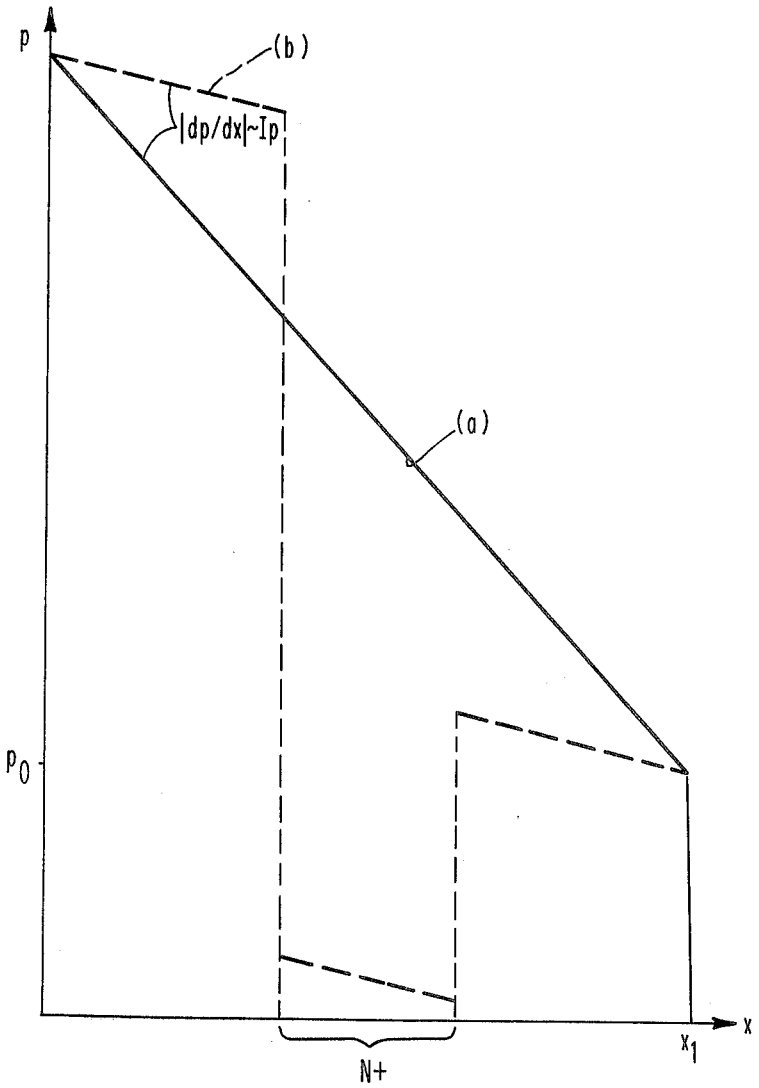

United States Defensive Publication [19] (H) [11] T969,010

Berger et al. [43] Apr. 4, 1978

[54] MONOLITHICALLY INTEGRATED SEMICONDUCTOR STRUCTURE CONTAINING AT LEAST TWO DEVICES IN A COMMON ZONE AND TECHNIQUE FOR PREVENTING PARASITIC TRANSISTOR ACTION

[75] Inventors: Horst H. Berger, Sindelfingen; Siegfried K. Wiedmann, Stuttgart, both of Germany

[73] Assignee: International Business Machines Corporation, Armonk, N.Y.

[21] Appl. No.: 801,433

[22] Filed: May 20, 1977

Related U.S. Application Data

[63] Continuation of Ser. No. 690,224, May 26, 1976, abandoned.

[30] Foreign Application Priority Data

Aug. 1, 1975 Germany ..... 2534398

[51] Int. Cl.[2] ..... H01L 27/02; H01L 29/48

[52] U.S. Cl. ..... 357/46; 357/15; 357/48; 357/50; 357/89; 357/90

[57] ABSTRACT

To prevent a parasitic lateral transistor or thyristor effect in an integrated structure including a transistor and a further device sharing one common zone, a doped region which is more highly doped with regard to the common zone and which simultaneously constitutes a contact region is arranged between the components to be separated. This separating and contact region acts as a barrier reflecting an undesired minority carrier current flow injected from the further device. In the preferred embodiment, the transistor structure is a bipolar transistor and the further semiconductor device is a Schottky diode integrated into the collector zone of the bipolar transistor.

2 Claims, 2 Sheets Drawing, 27 Pages Specification

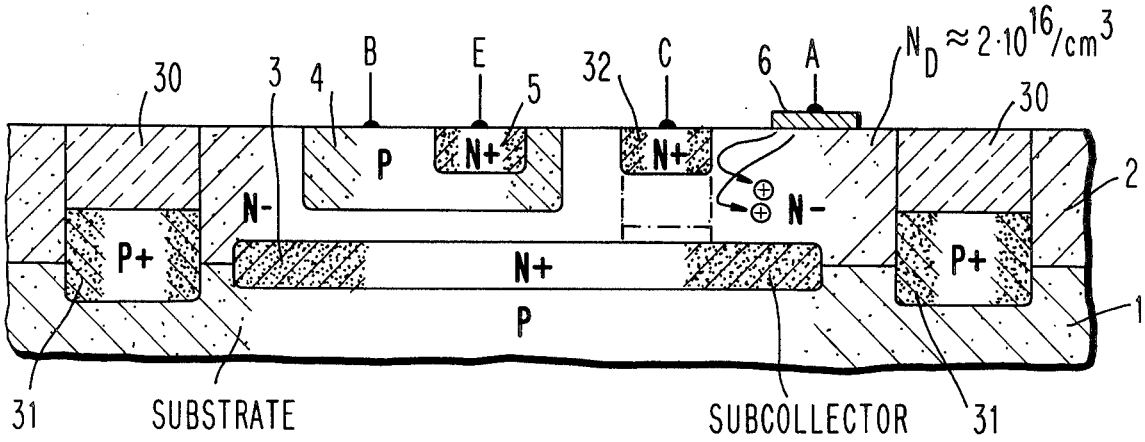

The file of this unexamined application may be inspected and copies thereof may be purchased (849 O.G. 1221, Apr. 9, 1968).